United States Patent
Zhong et al.

(10) Patent No.: US 8,410,609 B2
(45) Date of Patent: Apr. 2, 2013

(54) SEMICONDUCTOR DEVICE HAVING CARBON NANOTUBE INTERCONNECTS CONTACT DEPOSITED WITH DIFFERENT ORIENTATION AND METHOD FOR MANUFACTURING THE SAME

(75) Inventors: Huicai Zhong, Beijing (CN); Qingqing Liang, Beijing (CN); Zhijiong Luo, Poughkeepsie, NY (US); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 34 days.

(21) Appl. No.: 13/129,321

(22) PCT Filed: Feb. 26, 2011

(86) PCT No.: PCT/CN2011/071345
§ 371 (c)(1),
(2), (4) Date: May 13, 2011

(87) PCT Pub. No.: WO2012/024918
PCT Pub. Date: Mar. 1, 2012

(65) Prior Publication Data
US 2012/0193798 A1  Aug. 2, 2012

(30) Foreign Application Priority Data
Aug. 26, 2010 (CN) .......................... 2010 1 0264536

(51) Int. Cl.
*H01L 29/40* (2006.01)
*H01L 21/00* (2006.01)
(52) U.S. Cl. ......... 257/770; 257/751; 257/753; 438/108
(58) Field of Classification Search .......... 257/666–667, 257/E23.169, E23.178; 438/643–685
See application file for complete search history.

(56) References Cited

U.S. PATENT DOCUMENTS

| | | | |
|---|---|---|---|
| 7,402,909 B2 * | 7/2008 | Suh et al. | 257/753 |
| 7,468,320 B2 | 12/2008 | Hu et al. | |
| 7,744,947 B2 * | 6/2010 | Lee et al. | 427/58 |
| 7,781,260 B2 * | 8/2010 | Sane et al. | 438/108 |
| 2006/0281306 A1 | 12/2006 | Gstrein et al. | |
| 2008/0157375 A1 | 7/2008 | Lee | |
| 2009/0065932 A1 | 3/2009 | Sane et al. | |
| 2009/0072400 A1 * | 3/2009 | Zhu et al. | 257/751 |
| 2009/0108378 A1 * | 4/2009 | Zhu et al. | 257/412 |
| 2010/0130005 A1 | 5/2010 | Lee et al. | |
| 2010/0283093 A1 * | 11/2010 | Pei et al. | 257/303 |

OTHER PUBLICATIONS

International Searching Authority, International Search Report for International Application No. PCT/CN2011/071345, The State Intellectual Property Office of the P.R.C., mailed May 26, 2011, 7 pages, China.

* cited by examiner

*Primary Examiner* — Long Tran
*Assistant Examiner* — Dzung Tran
(74) *Attorney, Agent, or Firm* — Alston & Bird LLP

(57) ABSTRACT

The present invention relates to a semiconductor device structure and a method for manufacturing the same; the structure comprises: a semiconductor substrate on which a device structure is formed thereon; an interlayer dielectric layer formed on the device structure, wherein a trench is formed in the interlayer dielectric layer, the trench comprises an incorporated via trench and a conductive wiring trench, and the conductive wiring trench is positioned on the via trench; and a conductive layer filled in the trench, wherein the conductive layer is electrically connected with the device structure; wherein the conductive layer comprises a conductive material and a nanotube/wire layer surrounded by the conductive material. Wherein, the conductive layer comprises a conductive material and a nanotube/wire layer surrounded by the conductive material. The conductive layer of the structure has better thermal conductivity, conductivity and high anti-electromigration capability, thus is able to effectively prevent metal ions from diffusing outwards.

18 Claims, 9 Drawing Sheets

SEMICONDUCTOR DEVICE HAVING CARBON NANOTUBE INTERCONNECTS CONTACT DEPOSITED WITH DIFFERENT ORIENTATION AND METHOD FOR MANUFACTURING THE SAME

CROSS REFERENCE TO RELATED APPLICATIONS

This application is a national stage application, filed under 35 U.S.C. §371, of International Application No. PCT/CN2011/071345, filed Feb. 26, 2011, which claims the priority of Chinese Patent Application No. 201010264536.6, filed Aug. 26, 2010, all of which are hereby incorporated by reference in their entirety.

FIELD OF THE INVENTION

The present invention generally relates to a semiconductor device structure and a method for manufacturing the same, and specifically, to a semiconductor device structure with an interconnect structure of better performance and a method for manufacturing the same.

BACKGROUND OF THE INVENTION

With the rapid development of the semiconductor technology, integrated circuits with better performance and more powerful functions require greater element density, thus the sizes of CMOS (Complementary Metal Oxide Semiconductor) devices and of components such as metal wirings have to be further scaled, so as to enable the devices to run increasingly faster. However, the scaling in the sizes of metal wirings also results in increase of resistance of the metal wirings, which may consequently cause such a problem that the signal transmission speed of the metal wirings lags behind the operation speed of the devices.

As the industry comes into the nanometer era, the sizes of the devices are further scaled, the local interconnect structures, including incorporated vias and metal wirings, are replaced by the metal Cu or other materials which have smaller resistance rate but better anti-electro-migration capability. Nonetheless, metal ions in these metal materials would easily diffuse into the semiconductor structure, and thus cause shorts in the device structure or other problems of poor performance.

Accordingly, in order to solve the above mentioned problems existing in the interconnect structures, there is a need for a novel semiconductor device structure and a method for manufacturing the same structure.

SUMMARY OF THE INVENTION

The present invention provides A method for manufacturing a semiconductor structure, comprising: providing a semiconductor substrate on which a device structure is formed; forming an interlayer dielectric layer on the device structure, and patterning the interlayer dielectric layer to form a trench which comprises an incorporated via trench and a conductive wiring trench, wherein the conductive wiring trench is positioned on the via trench; and forming a conductive layer within the trench to fill up the trench, wherein the conductive layer is electrically connected with the device structure; wherein the conductive layer comprises a conductive material and a nanotube/wire layer surrounded by the conductive material.

The present invention further provides a semiconductor structure manufactured in accordance with the aforesaid method; the structure comprises: a semiconductor substrate on which a device structure is formed thereon; an interlayer dielectric layer formed on the device structure, wherein a trench is formed in the interlayer dielectric layer, the trench comprises an incorporated via trench and a conductive wiring trench, and the conductive wiring trench is positioned on the via trench; and a conductive layer filled in the trench, wherein the conductive layer is electrically connected with the device structure; wherein the conductive layer comprises a conductive material and a nanotube/wire layer surrounded by the conductive material.

In the embodiments of the present invention, the metal wiring and the interconnect structure with incorporated vias, which are formed according to the method for manufacturing a semiconductor structure, are formed with a conductive material and a nanotube/wire layer surrounded by the conductive material; since the nanotube/wire has unique physical structure and physical and chemical properties, it enables the conductive layer to have better thermal conductivity, conductivity and high anti-electromigration capability, thereby improving the signal transmission speed at the conductive layer, which thus enables its signal transmission speed to match with the increasingly enhanced speed of the devices. Besides, since the carbon nanotube/wire is a structure formed by single-layer carbon atoms or metal atoms, thus it is favorable for preventing the metal or other ions within the conductive material from diffusing into other places in the semiconductor structure, and is able to provide an interconnect structure of high quality, and also is able to reduce short circuits taking place in the semiconductor structure.

DETAILED DESCRIPTION OF THE INVENTION

The present invention generally relates to a method for manufacturing a semiconductor structure. The following disclosure provides a plurality of different embodiments or examples to achieve different structures of the present invention. To simplify the disclosure of the present invention, description of components and arrangements of specific examples is given. Of course, they are only illustrative and not limiting the present invention. Moreover, in the present invention, reference number(s) and/or letter(s) may be repeated in different embodiments. Such repetition is for the purposes of simplification and clearness, and does not denote the relationship between the respective embodiments and/or arrangements being discussed. In addition, the present invention provides various examples for specific processes and materials. However, it is obvious for a person of ordinary skill in the art that other processes and/or materials may alternatively be utilized. Furthermore, the following structure in which a first object is "on" a second object may include an embodiment in which the first object and the second object are formed to be in direct contact with each other, and may also include an embodiment in which another object is formed between the first object and the second object such that the first and second objects might not be in direct contact with each other.

Figure 1:
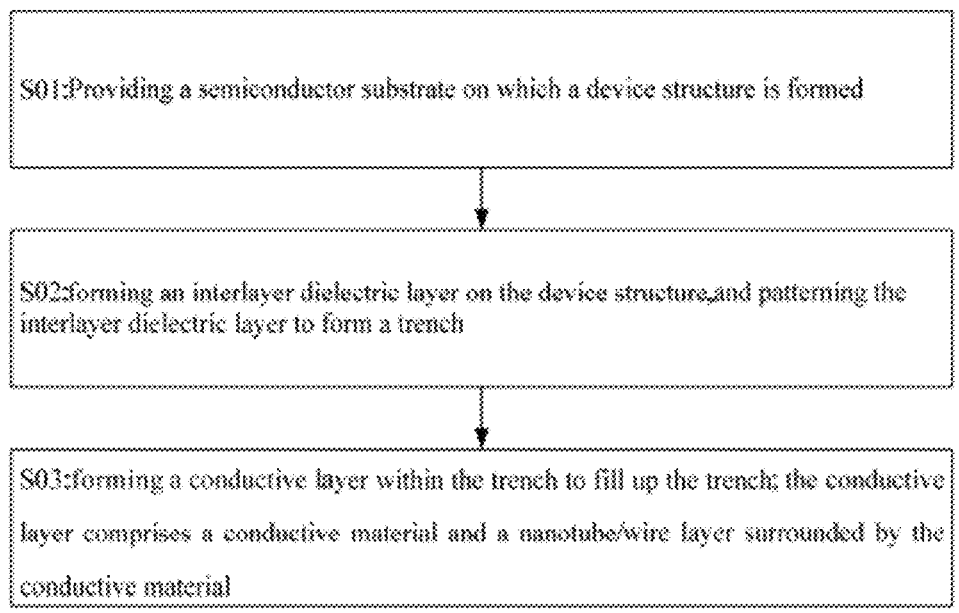
FIG. 1 is a flowchart of a method for manufacturing a semiconductor device structure according to an embodiment of the present invention.
Figure 2:
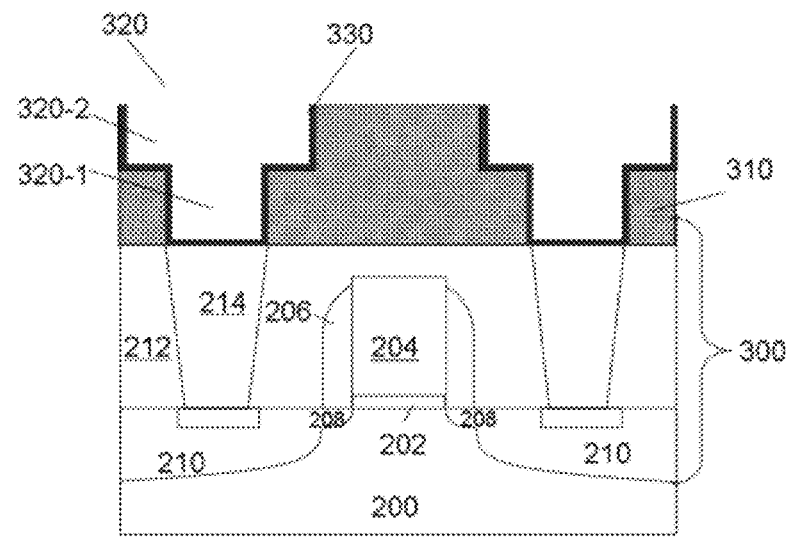
FIGS. 2-14 illustrate cross-sectional views in respective stages for manufacturing the semiconductor device structure according to the embodiment of the present invention.
Figure 3:
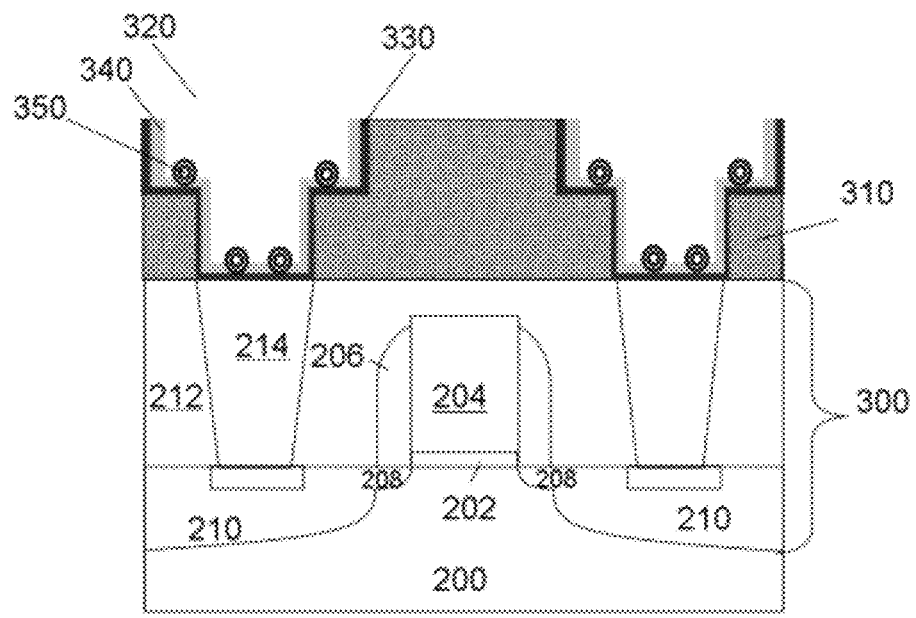

FIG. 1, to which it is referred, is a flowchart of a method for manufacturing a semiconductor device structure according to an embodiment of the present invention. In step S01, with reference to FIG. 2, a semiconductor substrate 200 is provided, wherein a device structure 300 is formed on the semiconductor substrate 200, as shown in FIG. 3. The substrate 200 comprises a crystalline silicon substrate (for example, a wafer), and may further comprise other basic semiconductors or compound semiconductors, such as Ge, SiGe, GaAs, InP, Si:C or diamond. According to the design specifications known in the prior art (for example, a p-type substrate or an n-type substrate), the substrate 200 may be of various doping levels. Additionally, the substrate 200 may optionally include an epitaxial layer, and may be manipulated by stress to enhance performance, and may comprise a Silicon On Insulator (SOI) structure.

The device structure may comprise a transistor, a diode or other semiconductor assembly, and other electronics device(s) or interconnect structure(s), etc. With reference to FIG. 2, an exemplary semiconductor device 300 of the device structure of the present invention is illustrated therein. The method for forming the semiconductor device 300 may comprise firstly forming a gate dielectric layer 202 and a gate electrode 204 sequentially on a semiconductor substrate 200. Next, tilted ion implantation is performed to form source/drain extension regions 208 in the semiconductor substrate 200. Alternatively, a Halo implantation region may be further formed. Next, spacers 206 are formed around the outer sidewalls of the gate dielectric layer 202 and the gate electrode 204, and ion implantation is performed with the gate electrode 204 and the sidewall spacer 206 as a mask, so as to form source/drain regions 210 within the semiconductor substrate on both sides of the gate electrode 204. Then the implanted ions are activated by means of annealing so as to form source/drain regions 210 within the semiconductor substrate on both sides of the gate electrode 204. Then, an interlayer dielectric layer 212 is formed to cover the device, and a conductive contact 214 is formed within the interlayer dielectric layer 212 positioned at the source/drain regions 210. The structure of the semiconductor device 300 on the semiconductor substrate and its formation method are merely exemplary, thus it may be other device structures, and may further comprise other semiconductor components, other dielectric layers, and other interconnect structures, etc. The disclosure here is merely exemplary and not limiting the present invention.

In step S02, an interlayer dielectric layer 310 is formed on the device structure 300, and then the interlayer dielectric layer 310 is patterned to form a trench 320 which comprises an incorporated via trench 320-1 and a conductive wiring trench 320-2, as shown in FIG. 2. The Damascene process may be applied to pattern the interlayer dielectric layer 310, in which the trench 320 comprising of the via trench 320-1 and the conductive wiring trench 320-2 is formed. The via trench 320-1 may be formed before formation of the conductive wiring trench 320-2; or alternatively, the via trench 320-1 may be formed after the formation of the conductive wiring trench 320-2.

It can be seen from FIG. 2 that the via trench and the device structure are interconnected, such that the via trench may be electrically connected with the device structure after it is filled with conductive materials.

Optionally, after formation of the trench 320, an insulating layer (not shown in the figures) may be formed on its sidewalls. The insulating layer may comprise nitride, oxide, or any other appropriate material, so as to prevent metal ions in a conductive layer to be formed subsequently from diffusing into the semiconductor structure.

Preferably, after formation of the trench 320 or the insulating layer, a barrier layer 330 may be formed at the bottom and the sidewalls of the trench 320, as shown in FIG. 2. The barrier layer 330 may be deposited on the inner walls of the trench 320 by means of a conventional deposition process, for example, Physical Vapor Deposition (PVD). The barrier layer is made of any one or more of TaN, TiN, Ta, Ti, TiSiN, TaSiN, TiW, WN and Ru. The barrier layer functions to prevent metal ions in a conductive layer to be formed sequentially from diffusing into the semiconductor structure.

In step S03, a conductive layer is formed within the trench 320 to fill up the trench 320, wherein the conductive layer comprises a conductive material 340 and a nanotube/wire layer 350 surrounded by the conductive material 340.

Figure 7:
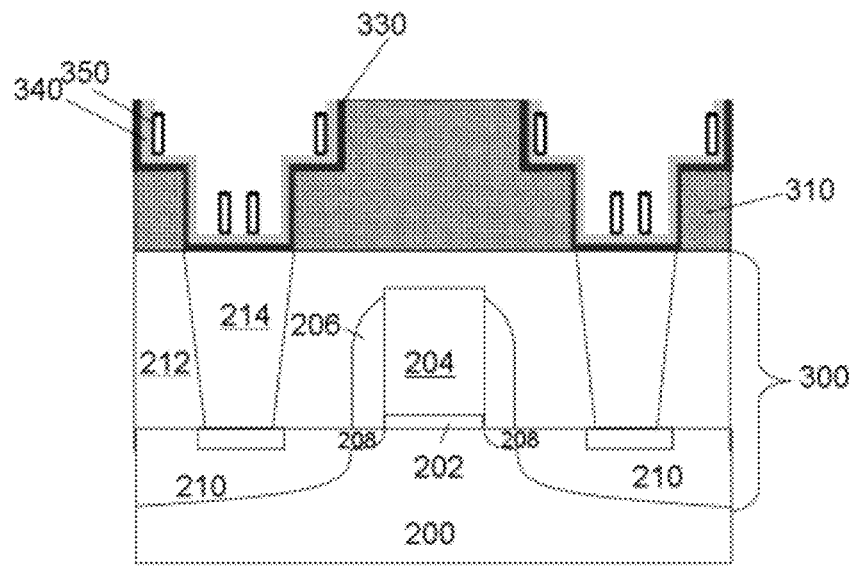
Figure 11:
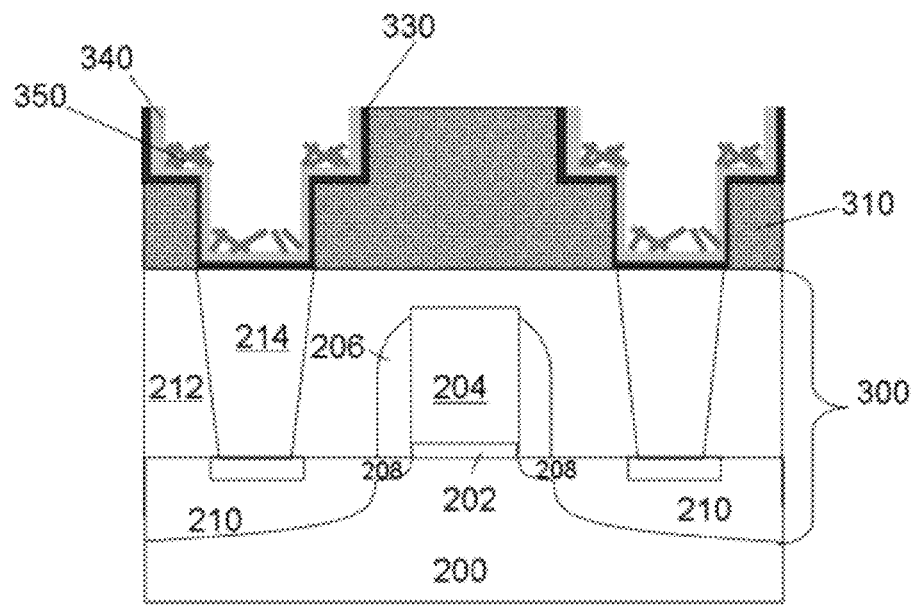
Figure 15:
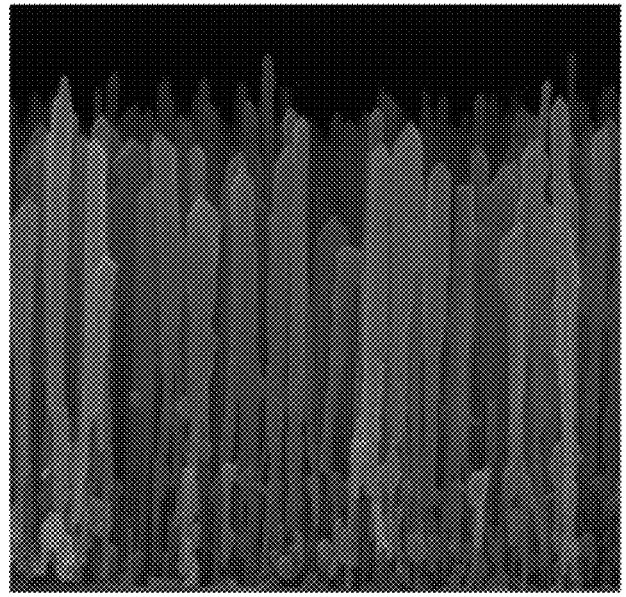
FIG. 15 illustrates a schematic diagram for a nanotube/wire in the vertical direction in the embodiment of the present invention.
Figure 16:
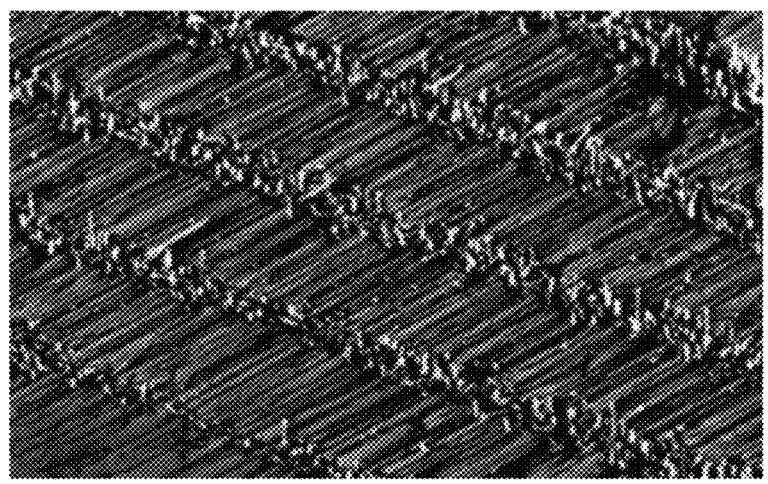
FIG. 16 illustrates a schematic diagram for the nanotube/wire in the horizontal direction in the embodiment of the present invention.
Figure 17:
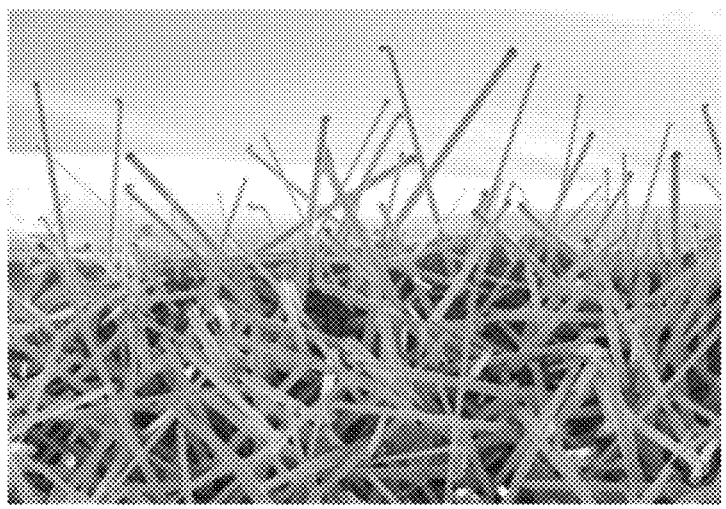
FIG. 17 illustrates the schematic diagram for a nanotube/wire mesh in the embodiment of the present invention.

Specifically, a conductive material, for example a metal material such as a copper (Cu) seed layer 340, may be deposited on the barrier layer 330 by a process such as CVD (Chemical Vapor Deposition). The metal material may further comprise Al, W or other materials as appropriate. Then, a carbon nanotube/wire layer 350 is formed on the copper (Cu) seed layer 340. With the direction of the bottom surface of the trench 320 in a horizontal direction as the reference direction, in an embodiment, the carbon nanotube/wire layer 350 may be a nanotube/wire in the horizontal direction, as shown in FIG. 3; in another embodiment, it may be a nanotube/wire in the vertical direction, as shown in FIG. 7; and in an additional embodiment, it may further be a nanotube/wire mesh, as shown in FIG. 11. The nanowire may be a metal nanowire, for example, Au, Ta, Cu and the like. And the nanotube may be a carbon nanotube or other conductive nanotubes such as a metal nanotube. FIGS. 15, 16 and 17 illustrate the schematic diagrams for the nanotube/wire in the vertical direction, the nanotube/wire in the horizontal direction and the nanotube/wire mesh for the embodiments of the present invention, respectively. The nanotube/wire may further tilt at any angle with respect to the semiconductor substrate.

The conductive material may be formed by PVD, CVD, Atomic Layer Deposition (ALD), PLD (Pulsed Laser Deposition), Metal Organic Chemical Vapor Deposition (MOCVD), Plasma Enhanced ALD (PEALD), sputtering, Molecular Beam Epitaxy (MBE), etc. The carbon nanotube/wire may be formed by methods such as CVD, Arc discharge, or laser ablation or any other processes as appropriate. The metal nanotube/wire may be formed by means of, for example, hard/soft template process, optical/electrochemical reduction process, seed mediated growth method or any other methods as appropriate. The forming of a carbon nanotube/wire may refer to the prior art and thus is omitted here.

Figure 4:
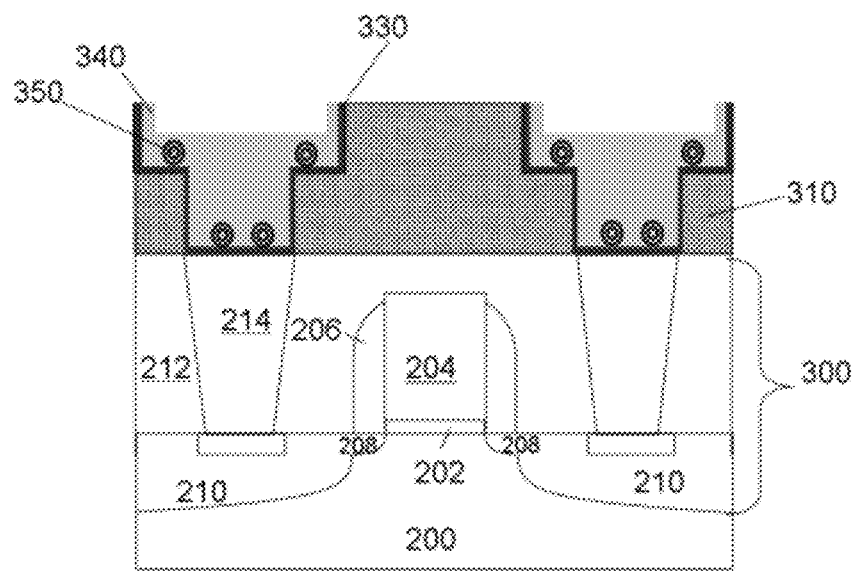
Figure 8:
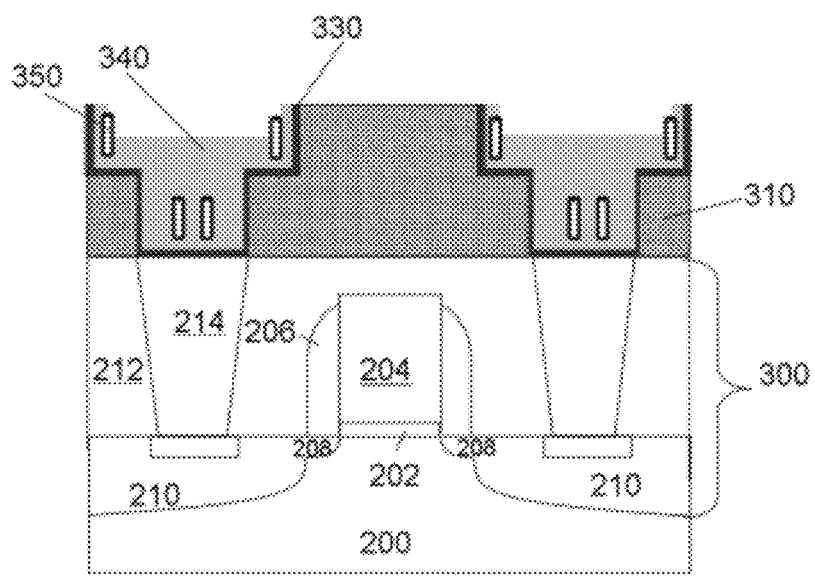
Figure 12:
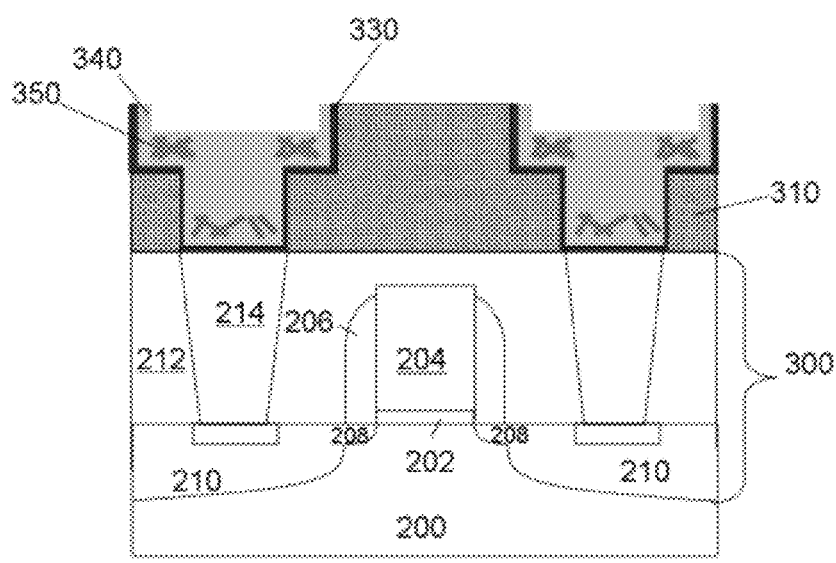

Next, a metal material 340 such as Cu, Al or W is formed on the nanotube/wire mesh. In an embodiment, Cu is partially filled into the trench, for example, by plating, as shown in FIG. 4, FIG. 8 and FIG. 12.

Figure 5:
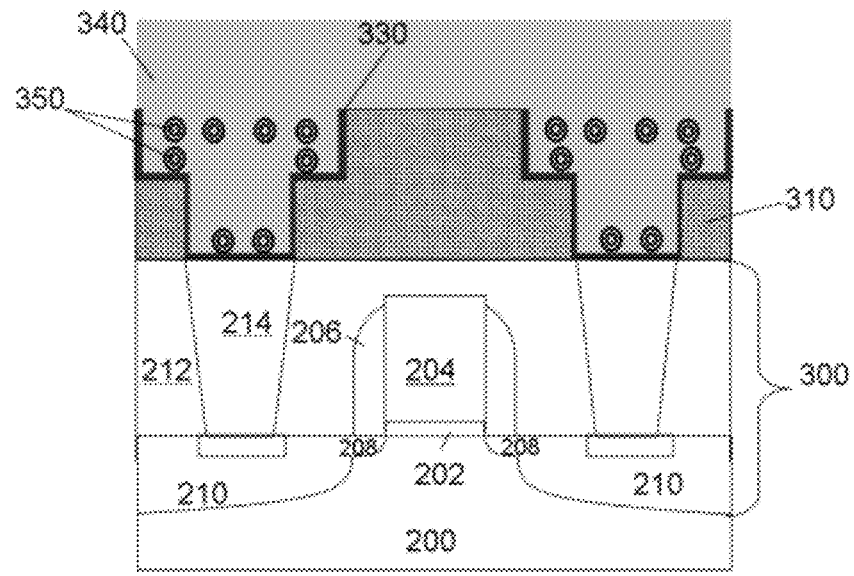
Figure 9:
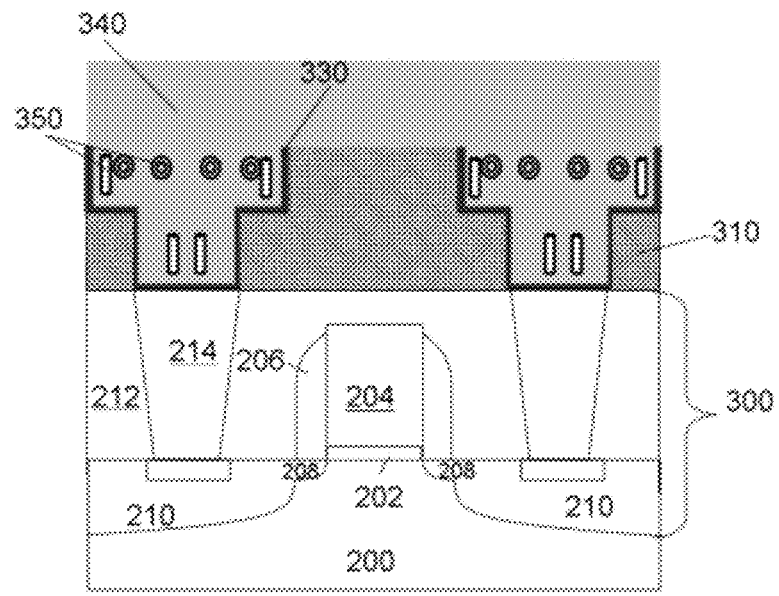
Figure 13:
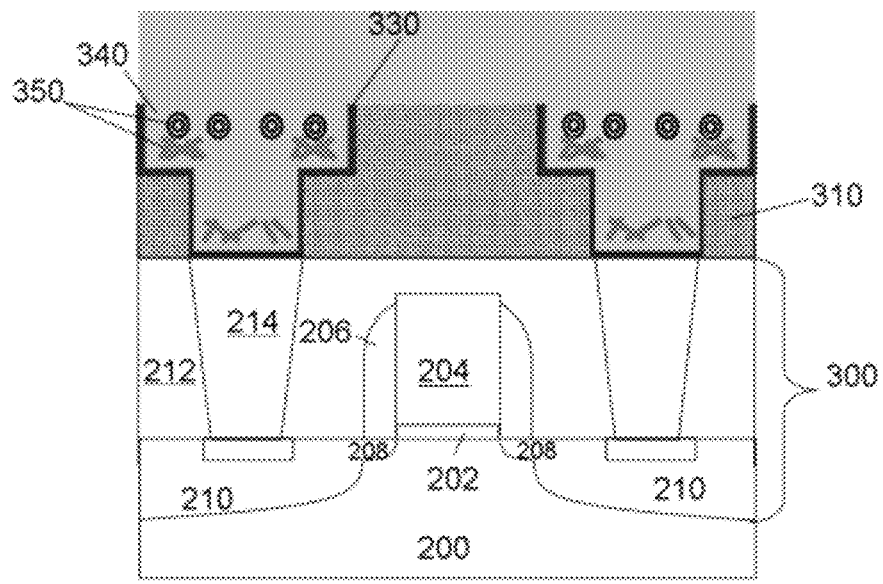

Then, another carbon nanotube/wire layer 350 is formed on the metal material. Similar to the aforesaid carbon nanotube/wire layer, the carbon nanotube/wire layer 350 may be a nanotube/wire in the vertical direction, a nanotube/wire in the horizontal direction, or a nanotube/wire mesh, on which the metal material 340 such as Cu is filled. The carbon nanotube/wire layer and the filling metal material 340 may be formed repeatedly as appropriate to fill up the trench 320, as shown in FIG. 5, FIG. 9 and FIG. 13. However, aforesaid illustrations are merely exemplary, and the carbon nanotube/wire formed each time may be a nanotube/wire in the vertical direction, a nanotube/wire in the horizontal direction, or a nanotube/wire mesh.

Figure 6:
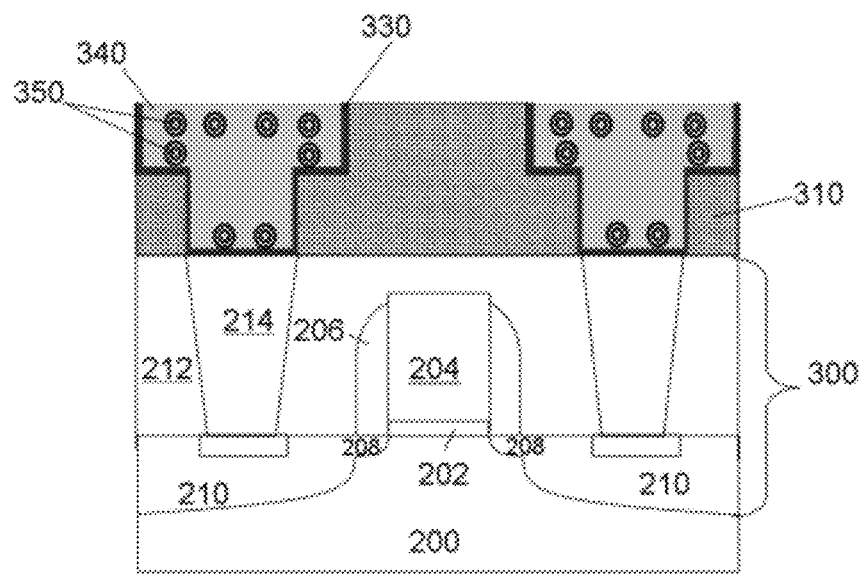
Figure 10:
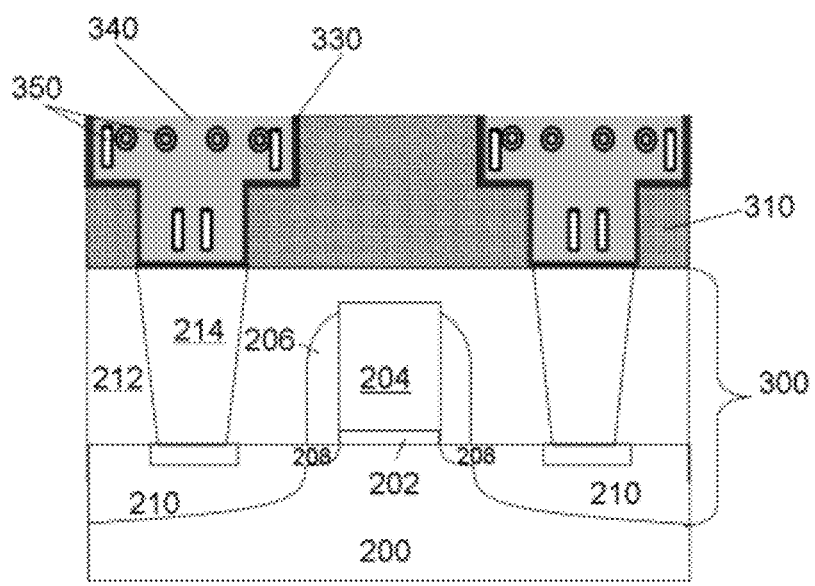
Figure 14:
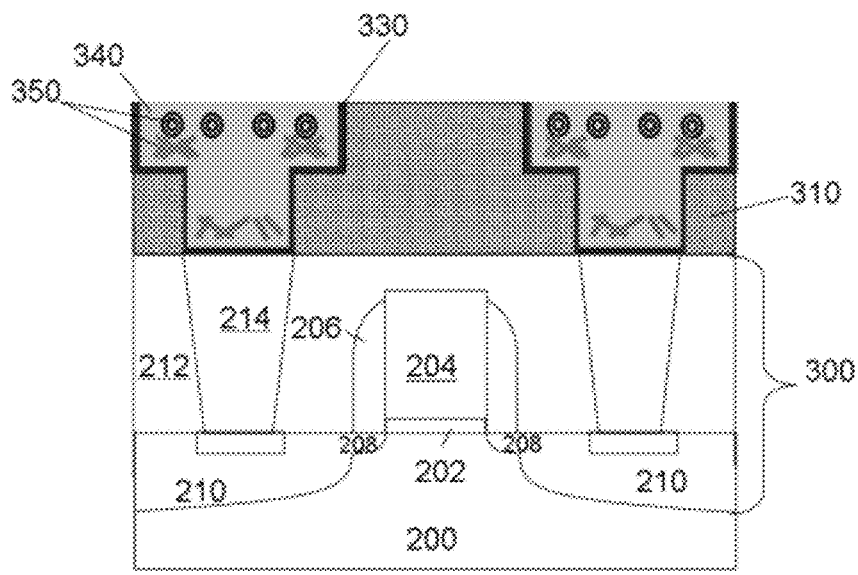

Then, the metal material is planarized by means of such as Chemical-mechanical polishing (CMP) so that the conductive layer may be substantially flushed with the interlayer dielectric layer, as shown in FIG. 6, FIG. 10 and FIG. 14. It is can be seen from the figures that the bottom of the trench is relatively narrower, and the metal material therein serves as a metal via in the through hole. While the upper part of the trench is relatively wider, and the metal material therein serves as a metal wiring, so as to realize the interconnection with other semiconductor structures.

Then, the subsequent process steps may be performed as needed. For example, another interconnect structure, another interlayer dielectric layer or other components may be formed thereon.

Besides forming one metal layer, the method for manufacturing a semiconductor device structure of the embodiment for the present invention may be performed both for manufacturing of the first metal layer and for manufacturing of other metal layers in Back end of line (BEOL). The foregoing embodiments are not for limiting the present invention.

According to the aforesaid method, the present invention further provides a semiconductor device structure formed by means of the aforesaid method, as shown in FIG. 6, FIG. 10 and FIG. 14. The structure comprises: a semiconductor substrate 200 on which a device structure 300 is formed; an interlayer dielectric layer 310 formed on the device structure 300, wherein the interlayer dielectric layer has a trench 320 therein, the trench 320 comprises an incorporated via trench 320-1 and a conductive wiring trench 320-2, and the conductive wiring trench 320-2 is positioned on the via trench 320-1; a conductive layer filled in the trench 320 and electrically connected with the device structure, wherein the conductive layer comprises a conductive material 340 and a nanotube/wire layer 350 surrounded by the conductive material 340. The nanotube/wire layer 350 is a structure having at least one layer, and the conductive material 340 is a structure having at least two layers. The nanotube/wire layer is arranged within the conductive layer in any one or any combination of the following manners: being parallel to the semiconductor substrate, being vertical to the semiconductor substrate, tilting respect to the semiconductor substrate, or forming a nanotube/wire mesh structure. The nanotube/wire layer comprises a carbon nanotube/wire, a metal nanotube/wire, or any combination thereof. The material for forming the conductive layer may be a metal which, for example, may comprise Cu, Al or W. The nanotube/wire layer 350 comprises a carbon nanotube/wire, a metal nanotube/wire, or any combination thereof. Preferably, the structure may further comprise a barrier layer formed between the conductive layer and sidewalls and bottom of the trench. Optionally, the structure may further comprise an insulating layer formed between the conductive layer and sidewalls of the trench. The insulating layer and the barrier layer may prevent metal ions in the conductive layer from diffusing into the semiconductor structure.

The device structure may comprise a transistor, a diode or other semiconductor components, and other electronic devices or interconnect structures, etc. With reference to FIG. 2, an embodiment for the device structure of the present invention is illustrated. With the semiconductor device 300 as an example, it comprises a gate dielectric layer 202 and a gate electrode 204 on a semiconductor substrate 200; spacers 206 formed around the gate dielectric layer 202 and the gate electrode 204; and source/drain extension regions 208 and source/drain regions 210 formed within the substrate 200 at both sides of the gate electrode 204. Optionally, the device structure may further comprise a Halo implantation region; an interlayer dielectric layer 212 which covers the source/drain regions; and a contact 214 within the interlayer dielectric layer 212 on the source/drain regions 210. The structure of the semiconductor device 300 is merely exemplary. Thus it may be other integrated circuit element, and may further comprise other semiconductor components or other dielectric layers and other interconnect structures, etc. The disclosure here is merely exemplary and not limiting the present invention.

The semiconductor device structure of the embodiment of the present invention may be applied to the first metal layer and the subsequent metal layers. The embodiment shown in FIG. 2 is not limiting the present invention.

The semiconductor device structure having an incorporated interconnect structure with a nanotube/wire layer and the method for manufacturing the same is described in detail. A conductive layer i.e. an interconnect structure, which comprises a metal material and a nanotube/wire layer surrounded by the metal material is formed, so that the conductive layer has better thermo-conductivity, conductivity and high anti-electromigration capability due to the particular electrical-physical structure and physicochemical properties of the nanotube/wire, thus the signal transmission speed of the conductive layer is improved, and the signal transmission speed may be matched with the increasingly enhanced device speed. Additionally, because the carbon nanotube/wire is a structure formed by single-layer C atoms or metal atoms, it is quite favorable for preventing the metal ions or other ions in the conductive material from diffusing into other places in the semiconductor structure, and is able to provide an interconnect structure of high quality, and reduce shorts in the semiconductor structure.

Although the embodiments and their advantages have been described in detail, it is readily apparent to those having ordinary skill in the art that various alterations, substitutions and modifications may be made to the embodiments without departing from the spirit of the present invention and the scope as defined by the appended claims. For other examples, it may be easily recognized by a person of ordinary skill in the art that the order of the process steps may be changed without departing from the scope of the present invention.

In addition, the scope to which the present invention is applied is not limited to the process, mechanism, manufacture, material composition, means, methods and steps described in the specific embodiments in the specification. A person of ordinary skill in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A method for manufacturing a semiconductor structure, comprising:

providing a semiconductor substrate on which a device structure is formed;

forming an interlayer dielectric layer on the device structure, and patterning the interlayer dielectric layer to form a trench which comprises an incorporated via trench and a conductive wiring trench, wherein the conductive wiring trench is positioned on the via trench; and forming a conductive layer within the trench to fill up the trench, wherein the conductive layer is electrically connected with the device structure;

wherein the conductive layer comprises a conductive material and a nanotube/wire layer surrounded by the conductive material; wherein the nanotube/wire layer is deposited with a mesh orientation.

2. The method according to claim 1, wherein the step of forming a conductive layer within the trench to fill up the trench comprises:

a. forming a conductive material within the trench, and a nanotube/wire layer thereon;

b. forming a conductive material on the nanotube/wire layer; and c. repeating steps a and b till the conductive material fills up the trench.

3. The method according to claim 2, wherein the method further comprises the following step before step a:

forming a barrier layer at bottom and sidewalls of the trench.

4. The method according to claim 1, wherein the nanotube/wire layer comprises a carbon nanotube/wire, a metal nanotube/wire, or any combination thereof.

5. The method according to claim 1, wherein the nanotube/wire layer is arranged within the conductive layer in any one or any combination of the following manners: being parallel to the semiconductor substrate, being vertical to the semiconductor substrate, tilting with respect to the semiconductor substrate, and forming a nanotube/wire mesh structure.

6. The method according to according to claim 1, wherein the conductive material comprises Cu, Al, W or any combination thereof.

7. A semiconductor structure, comprising:

a semiconductor substrate on which a device structure is formed thereon;

an interlayer dielectric layer formed on the device structure, wherein a trench is formed in the interlayer dielectric layer, the trench comprises an incorporated via trench and a conductive wiring trench, and the conductive wiring trench is positioned on the via trench; and a conductive layer filled in the trench, wherein the conductive layer is electrically connected with the device structure;

wherein the conductive layer comprises a conductive material and a nanotube/wire layer surrounded by the conductive material; wherein the nanotube/wire layer is deposited with a mesh orientation.

8. The structure according to claim 7, wherein the nanotube/wire layer comprises at least one layer, and the conductive material comprises at least two layers.

9. The structure according to claim 7, further comprising a barrier layer formed between the conductive layer and sidewalls and bottom of the trench.

10. The structure according to claim 7, wherein the nanotube/wire layer is arranged within the conductive layer in any one or any combination of the following manners: being parallel to the semiconductor substrate, being vertical to the semiconductor substrate, tilting with respect to the semiconductor substrate, and forming a nanotube/wire mesh structure.

11. The structure according to claim 7, wherein the conductive material comprises: Cu, Al, W or any combination thereof.

12. The structure according to claim 7, wherein the nanotube/wire layer comprises a carbon nanotube/wire, a metal nanotube/wire, or any combination thereof.

13. The method according to claim 2, wherein the nanotube/wire layer comprises a carbon nanotube/wire, a metal nanotube/wire, or any combination thereof.

14. The method according to claim 2, wherein the nanotube/wire layer is arranged within the conductive layer in any one or any combination of the following manners: being parallel to the semiconductor substrate, being vertical to the semiconductor substrate, tilting with respect to the semiconductor substrate, and forming a nanotube/wire mesh structure.

15. The method according to claim 2, wherein the conductive material comprises Cu, Al, W or any combination thereof.

16. The structure according to claim 8, wherein the nanotube/wire layer is arranged within the conductive layer in any one or any combination of the following manners: being parallel to the semiconductor substrate, being vertical to the semiconductor substrate, tilting with respect to the semiconductor substrate, and forming a nanotube/wire mesh structure.

17. The structure according to claim 8, wherein the conductive material comprises: Cu, Al, W or any combination thereof.

18. The structure according to claim 8, wherein the nanotube/wire layer comprises a carbon nanotube/wire, a metal nanotube/wire, or any combination thereof.

* * * * *